United States Patent [19]

Nakai et al.

[11] Patent Number: 4,819,212

[45] Date of Patent: Apr. 4, 1989

[54] NONVOLATILE SEMICONDUCTOR MEMORY DEVICE WITH READOUT TEST CIRCUITRY

[75] Inventors: Hiroto Nakai, Kawasaki; Hiroshi Iwahashi, Yokohama; Masamichi Asano, Tokyo; Isao Sato, Yokohama; Shigeru Kumagai, Tokyo; Kazuto Suzuki, Niigata, all of Japan

[73] Assignee: Kabushiki Kaisha Toshiba, Kawasaki, Japan

[21] Appl. No.: 50,717

[22] Filed: May 18, 1987

[30] Foreign Application Priority Data

May 31, 1986 [JP] Japan ................................ 61-126359
Jul. 4, 1986 [JP] Japan ................................ 61-157299

[51] Int. Cl.[4] .......................... G11C 7/00; G11C 7/02; G11C 8/00
[52] U.S. Cl. ...................... 365/230; 365/207; 365/210; 365/189
[58] Field of Search ................ 365/207, 210, 189, 230

[56] References Cited

U.S. PATENT DOCUMENTS 4,340,943  7/1982  Asano et al. .................... 365/210
4,644,501  2/1987  Nagasawa ....................... 365/210
4,692,904  9/1987  Sato et al. ...................... 365/189
4,706,219 11/1987  Miyata et al. ................... 365/189

FOREIGN PATENT DOCUMENTS 2053611  2/1981  United Kingdom .

Primary Examiner—Terrell W. Fears
Assistant Examiner—Melissa J. Koval
Attorney, Agent, or Firm—Finnegan, Henderson, Farabow, Garrett, & Dunner

[57] ABSTRACT

A nonvolatile semiconductor memory device includes a memory cell array including a plurality of memory cells each including a nonvolatile transistor, a plurality of row lines each connected to the memory cells arranged on a corresponding row, a plurality of column lines connected to the memory cells arranged on a corresponding column, an address buffer circuit for receiving external address signals at its address input terminal and for outputting internal address signals in response to the received external address signals, column line-select transistors connected to the column lines, a column-decoding circuit for selectively biasing the column line-select transistors, a row-decoding circuit for selectively biasing the row lines, and data-detecting circuit for detecting the potential of the column line selected by the column line-select transistor. The device further includes a control unit generating a control signal for controlling the address buffer circuit so that the internal address signal is set at a predetermined value, to set all the row lines in a non-selected state, thereby setting a column line, selected by the column line-select transistor, at a predetermined potential.

17 Claims, 10 Drawing Sheets

NONVOLATILE SEMICONDUCTOR MEMORY DEVICE WITH READOUT TEST CIRCUITRY

BACKGROUND OF THE INVENTION

This invention relates to an electrically programmable nonvolatile semiconductor memory device which can be easily subjected to an electrical characteristic test with high reliability.

In recent times, a so-called UV-EPROM has come to be the most popular nonvolatile memory or programmable ROM (hereinafter referred to as a PROM). Data can be electrically programmed in the UV-EPROM and erased therefrom by use of ultraviolet radiation. It is well known that data is, in fact, rarely programmed in or erased from such a UV-EPROM very many times; mostly, it is programmed only once. However, since a memory cell of the UV-EPROM must be irradiated with ultraviolet rays in order to erase data, the memory chip is sealed into a package having a glass window for enabling the transmitting of ultraviolet rays and, hence, this package is expensive. For this reason, if data is programmed only once and will not need to be erased in the future, the memory chip is simply sealed into an inexpensive plastic package not having a window for the transmitting of ultraviolet rays. Such a UV-EPROM is called one-time PROM. In this type of one-time PROM, data cannot be erased after it has been programmed in.

After the memory chip is sealed into the package, a semiconductor memory is subjected to tests with predetermined data programmed therein, so as to determine whether various electrical characteristics of the memory chip (e.g., data readout time or rate and current consumption) satisfy the respective rated values. Memory chips not satisfying the rated values are rejected, and only those memory chips satisfying the rated values are shipped as products, after the test data is erased. However, data programmed in the one-time PROM sealed into a plastic package cannot be erased, and hence one-time PROMs cannot be subjected to the tests described above. Thus, in order to allow a user to program given data, a memory chip must be shipped in which no data is programmed.

Therefore, in order to perform the above tests, data is programmed in a memory chip before it is sealed into the package, i.e., when the memory chips are still in the form of a wafer, and then data is read out to check the readout rate. Thereafter, data is erased and memory chips satisfying the predetermined read rate are sealed into packages. However, according to this method, the readout rate of the memory cell sealed into the package cannot be directly checked because the memory chips are subjected to the tests while they remain in the form of a wafer. That is, a slight difference in the readout rate occurs before and after the memory chip is sealed into the package. For this reason the critical value of the readout rate is set slightly higher than the predetermined value when the test is performed for the memory chips still in wafer form. Any memory chips having a readout rate lower than the critical value is eliminated. As a result, the product yield drops, thereby increasing the manufacturing cost. In addition, since the memory chip may be damaged when it is sealed into the package, some sealed memory cells may become defective. If a user programs data in such a memory chip, the data readout rate may be greatly decreased, or erroneous data may be read out. Consequently, it is desirable to test the one-time PROMs after they have been sealed into the package.

SUMMARY OF THE INVENTION

It is therefore an object of the present invention to provide a nonvolatile semiconductor memory device which can be subjected to an electrical characteristic test before data is programmed in a memory chip, and after it has been sealed into a package.

The above object can be achieved by a nonvolatile semiconductor memory device comprising a memory cell array including a plurality of memory cells each constituted by a nonvolatile transistor; a plurality of row lines each connected to the memory cells arranged on a corresponding row; a plurality of column lines connected to the memory cells arranged on a corresponding column; address buffer means for receiving external address signals at its address input terminal and for outputting internal address signals in response to the received external address signals; column line-select transistors connected to the column lines; column-decoding means for selectively biasing the column line-select transistors; row-decoding means for selectively biasing the row lines; control means for generating a control signal for controlling the address buffer means so that the internal address signal is set at a predetermined value, to set all the row lines in a nonselected state, thereby setting a column line, selected by the column line-select transistor, at a predetermined potential; and data-detecting means for detecting the potential of the selected column line.

According to the present invention, the nonvolatile memory device is alternately set in a selection mode, for selecting at least one memory cell in accordance with an external address signal, and in a non-selection mode, for not selecting any memory cell regardless of the external address signal. Therefore, a test for checking the electrical characteristics such as readout rate can be easily and reliably executed.

DETAILED DESCRIPTION OF THE PREFERRED EMBODIMENTS

A nonvolatile semiconductor memory device according to embodiments of the present invention will now be described below with reference to the accompanying drawings.

Figure 1:
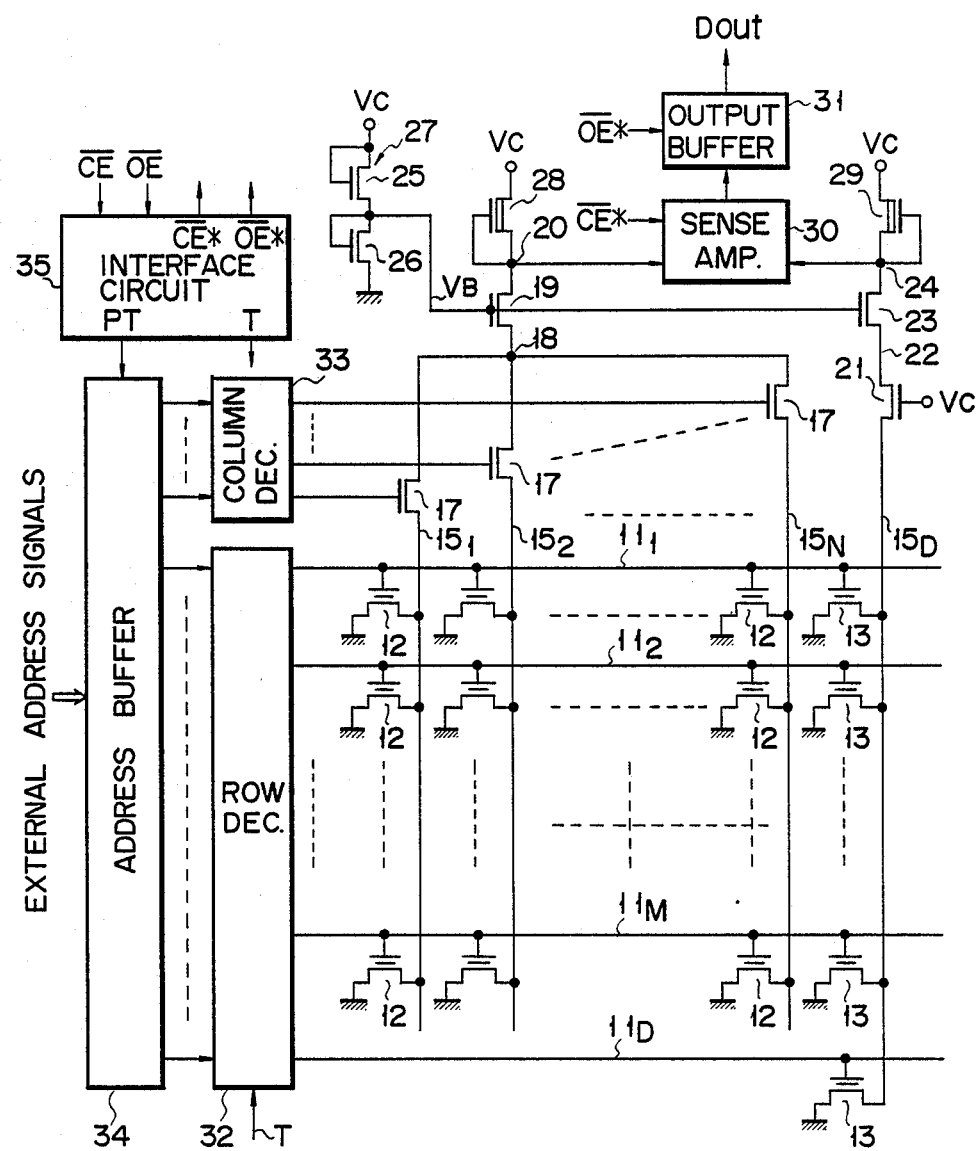
FIG. 1 is a circuit diagram of a nonvolatile memory according to an embodiment of the present invention.

FIG. 1 is a circuit diagram of a nonvolatile semiconductor memory device, according to an embodiment of the present invention, used as a one-time PROM from which programmed data cannot be erased.. This memory device includes memory cells 12 comprising by non-volatile transistors arranged in a matrix manner; row lines $11_1$ to $11_m$ each connected to gates of memory cells 12 on the corresponding row; dummy row line $11_D$; and dummy memory cells 13 comprising by non-volatile transistors whose gates are respectively connected to row lines $11_1$ to $11_M$ and line $11_D$. The drains of cells 12 on each column are respectively connected to column lines $15_1$ to $15_N$, and the drains of cells 13 are commonly connected to dummy column line $15_D$. In addition, all the sources of cells 12 and 13 are set at a low-potential power supply potential, e.g., at the ground potential. Data is not programmed in each of cells 12 and 13, so that each cell is in an erased state and its threshold voltage Vth is at a low level. Lines $15_1$ to $15_N$ are commonly connected to node 18 respectively through transistors 17 for selecting the corresponding column lines. In addition, node 18 is connected to node 20 through transistor 19. Line $15_D$ is connected to line 22 through transistor 21 equivalent to transistor 17, and line 22 is connected to node 24 through transistor 23 equivalent to transistor 19. Gates of transistors 19 and 23 are supplied with predetermined DC bias voltage $V_B$ lower than high-potential power supply voltage $V_C$. Voltage $V_B$ is generated by bias voltage generator 27 which has two connected transistors 25 and 26 in series between voltage terminal $V_C$ and ground. Node 20 is a data detection node set at a potential corresponding to memory data read out from cells 12, and depletion type load transistor 28 is connected between node 20 and power supply terminal $V_C$. In addition, node 24 is a reference potential node set at a reference potential for detecting memory data read out from cells 12, and depletion type load transistor 29 is connected between node 24 and terminal $V_C$. Note that the element size and the like are so set that an ON-resistance of transistor 28 is larger than that of transistor 29. Furthermore, sense amplifier 30 is connected between nodes 20 and 24 to amplify a potential difference therebetween and detect data from cells 12. Data detected by amplifier 30 is output from the memory through output buffer 31. An operation of amplifier 30 is controlled in response to internal chip enable signal $\overline{CE^*}$ to be described below, and an operation of buffer 31 is controlled in response to internal output enable signal $\overline{OE^*}$.

Lines $11_1$ to $11_M$ and line $11_D$ are selectively activated in response to decoded outputs from row decoder 32, and transistors 17 are selectively activated in response to decoded outputs from column decoder 33. Note that the gate of transistor 21 is normally supplied with voltage $V_C$ corresponding to level "1" of an activating signal from decoder 33 in order to duplicate the selected condition of transistors 17.

Decoders 32 and 33 are supplied with outputs from address buffer 34 for generating internal address signals from external address signals. In addition, reference numeral 35 denotes a control signal interface circuit for processing chip enable signal $\overline{CE}$ and output enable signal $\overline{OE}$ supplied to external terminals. Circuit 35 generates signal $\overline{CE^*}$ for controlling operations of amplifier 30 and the like and signal OE* for controlling operations of output buffer 31 in accordance with externally supplied signals $\overline{CE}$ and $\overline{OE}$, and also generates control signals PT and T for controlling operations of address buffer 34 and row decoder 32. Note that in the circuit shown in FIG. 1, all the transistors are of an enhancement type unless otherwise specified, and all the transistors are N-channel transistors.

A principle of a test operation for checking readout rate of the nonvolatile memory device shown in FIG. 1 will now be described below for explaining an arrangement of the embodiment.

When data is not programmed in the memory device of this type, each memory cell 12 is generally in an erased state and set in a memory state wherein data of level "1", i.e., with a low threshold voltage is stored. Therefore, in the memory device according to this embodiment, a dummy row line connected to a dummy memory cell (not shown) in which data of level "0", i.e., a high threshold voltage is programmed or line $11_D$, set in a state equivalent to the above dummy row line, is provided. Line $11_D$ is selected or normal lines $11_1$ to $11_M$ are selectively biased in accordance with the control signal externally supplied during the test, thereby measuring the data readout rate of the selected memory cell.

The threshold voltage of a memory cell in the memory device of this type in which data is programmed is sufficiently higher than that of a memory cell immediately after manufacture. For this reason, when the memory cell in which data is programmed is activated, the memory cell is not turned on. In this case, a potential of the column line connected to this memory cell is set at a high potential by a load circuit. In this state, when the memory cell which is connected to the same column line as that of the above memory cell and in which no data is programmed, i.e., in an erased state is activated, the potential of the column line, which is set at a high potential, is discharged to be a low potential because the threshold voltage of the memory cell has a low value. Since each memory cell is controlled to be activated in accordance with signals from the row lines, the data readout rate is determined by a time interval between turn-on of the selected memory cell and rise of the signal of the row line for activating the memory cell in the erased state. That is, the data readout rate can be measured by, in FIG. 1, supplying a predetermined row address signal, which is not associated with an external address signal, from buffer 34 to decoder 32 to select line $11_D$, setting line $15_D$ at a predetermined potential level and setting a selected one of lines $15_1$ to $15_N$ at the high potential level, and then supplying a row address signal, which corresponds to the external address signal, from buffer 34 to decoder 32 to select a corresponding one of memory cells 12.

When a memory cell in a programmed state is selected after the memory cell in the erased state is selected, the signal of the row line for selecting the memory cell in the erased state falls, and the signal of the row line for selecting the memory cell in the programmed state rises. However, the memory cell in the programmed state is not turned on even when the row line is set at level "1". For this reason, the readout rate in this case is determined by a time interval between fall of the signal of the row line for selecting the memory cell in the erased state and turn-off of the memory cell. That is, the data readout rate in this case can be measured by, in FIG. 1, selecting and turning on one of memory cells 12 corresponding to the external address signal, supplying a predetermined row address signal for turning off the memory cell and not associated with the external address signal to decoder 32, and setting all the row selection signals on lines $11_1$ to $11_M$ at a low level and selecting line $11_D$.

As described above, the data readout rate of the memory cell of this type is determined by the memory cell in the erased state. For this reason, even when all the memory cells are set in the erased state beforehand, the dummy row line connected to the dummy memory cell in which data is programmed or the dummy row line set in the state equivalent to the above dummy row line may be provided to measure the data readout rate.

Figure 2:
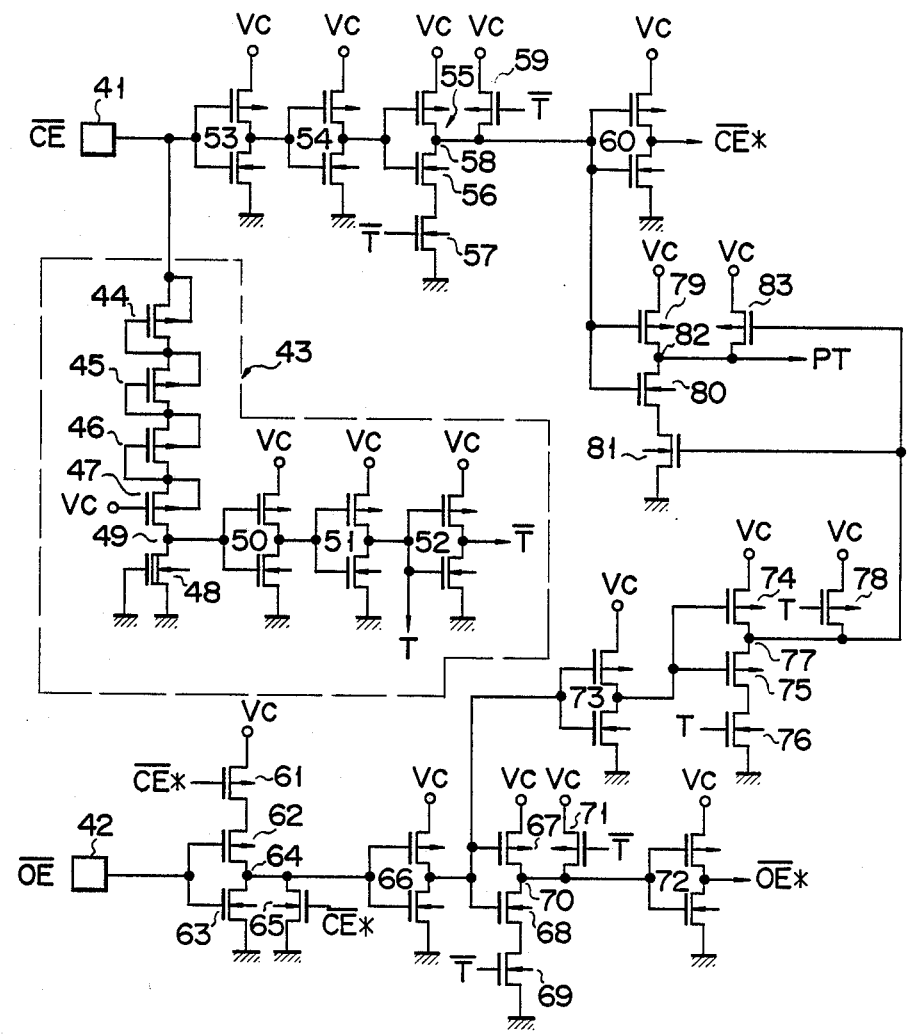
FIG. 2 is a circuit diagram of an interface circuit of the memory device shown in FIG. 1.

FIG. 2 is a circuit diagram of a detailed arrangement of control signal interface circuit 35. In FIG. 2, terminal 41 is an external terminal supplied with chip enable signal $\overline{CE}$, and terminal 42 is an external terminal supplied with output enable signal $\overline{OE}$. Terminal 41 is also supplied, during the test of the memory, with a voltage of +12 V which is higher than voltage $V_C$ corresponding to level "1" of signal $\overline{CE}$ when voltage $V_C$ is set at, e.g., +5 V.

High-voltage detector 43 is connected to terminal 41 to detect the voltage of +12 V. In detector 43, four enhancement type (E-type) P-ch MOS transistors (to be referred to as P-ch transistors hereinafter) 44 to 47 and depletion type (D-type) N-ch MOS transistor (to be referred to as an N-ch transistor hereinafter) 48 are connected in series between terminal 41 and the ground. The gates of transistors 44 to 46 are connected to the respective drains thereof, the gate of transistor 47 is connected to power supply terminal $V_C$, and the gate of transistor 48 is grounded. Signals from node 49 between series-connected transistors 47 and 48 are supplied to CMOS inverter 50, and output signals from inverter 50 are supplied to CMOS inverter 51. Output signals from inverter 51 are supplied to CMOS inverter 52. In detector 43, the size and the like of transistors 44 to 48 are so set that the potential of node 49 is set lower than the circuit threshold voltage of the inverter 50 when a voltage of +5 V is supplied to terminal 41, and that the potential of node 49 is set higher than the circuit threshold voltage when a voltage of +12 V is supplied to terminal 41. Therefore, when the voltage of +5 V or ground voltage is supplied to terminal 41, output signal T from inverter 51 is set at level "0", and output signal $\overline{T}$ from inverter 52 is set at level "1". When the voltage of +12 V is supplied to terminal 41, signal T from inverter 51 is set at level "1", and signal $\overline{T}$ from inverter 52 is set at level "0". When signal T is set at level "1", the memory is set in the test mode.

In addition, CMOS inverter 53 is connected to terminal 41. Output signals from inverter 53 are supplied to CMOS inverter 54. P-ch transistor 55 and two N-ch transistors 56 and 57 are connected in series between terminal $V_C$ and ground, and the gates of P-ch transistor 55 and N-ch transistor 56 are supplied with output signals from inverter 54. The gate of N-ch transistor 57 is supplied with signal T from detector 43. P-ch transistor 59 is connected to node 58 between series-connected transistors 55 and 56 and terminal $V_C$. The gate of transistor 59 is supplied with signal $\overline{T}$ from detector 43. Signals from node 58 are supplied to CMOS inverter 60. Output signals from inverter 60 are supplied to sense amplifier 30 as internal chip enable signal $\overline{CE}*$. Two P-ch transistors 61 and 62 and N-ch transistor 63 are connected in series between terminal $V_C$ and the ground. The gate of transistor 61 is supplied with signal $\overline{CE}*$, and the gates of transistors 62 and 63 receive signal $\overline{OE}$ supplied to terminal 42. N-ch transistor 65 is connected to node 64 between series-connected transistors 62 and 63 and ground, and the gate of transistor 65 receives signal $\overline{CE}*$. Signals from node 64 are supplied to CMOS inverter 66. P-ch transistor 67 and two N-ch transistors 68 and 69 are connected in series between terminal $V_C$ and ground. The gates of transistors 67 and 68 are supplied with output signals from inverter 66, and the gate of transistor 69 is supplied with signal $\overline{T}$. P-ch transistor 71 is connected to connecting node 70 between transistors 67 and 68 and terminal $V_C$, the gate of transistor 71 is also supplied with signal $\overline{T}$. Signals from node 70 are supplied to CMOS inverter 72. An output signal from inverter 72 is supplied to output buffer 31 and the like as internal output enable signal $\overline{OE}*$.

Output signals from inverter 66 are also supplied to CMOS inverter 73. P-ch transistor 74 and two N-ch transistors 75 and 76 are connected in series between terminal $V_C$ and ground, and the gates of transistors 74 and 75 are supplied with output signals from inverter 73. The gate of transistor 76 is supplied with signal T. P-ch transistor 78 is connected to connecting node 77 between transistors 74 and 75 and terminal $V_C$, and the gate of the transistor 78 is supplied with signal T.

P-ch transistor 79 and two N-ch transistors 80 and 81 are connected in series between terminal $V_C$ and ground. The gates of transistors 79 and 80 are supplied with signals from node 58, and the gate of transistor 81 is supplied with signals from node 77. P-ch transistor 83 is connected to connecting node 82 between transistors 79 and 80 and terminal $V_C$, and the gate of transistor 83 is supplied with signals from node 77. Signals from node 82 are supplied to address buffer 34 as control signal PT.

Figure 3:
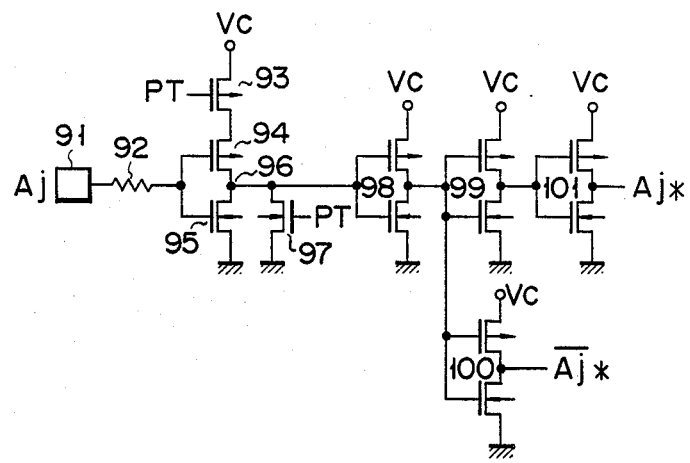
FIG. 3 is a circuit diagram of part of an address buffer of the memory device shown in FIG. 1.

FIG. 3 is a circuit diagram showing a circuit configuration of a section for processing one of bits of the external row address signal of address buffer 34 for generating the internal address signals on the basis of the external address signals. Terminal 91 is an external terminal supplied with one-bit external address signal Aj. Terminal 91 is connected to one terminal of protective resistor 92. Two P-ch transistors 93 and 94 and N-ch transistor 95 are connected in series between terminal $V_C$ and ground. The gate of transistor 93 is supplied with signal PT generated by control signal interface circuit 35 shown in FIG. 2, and the gates of transistors 94 and 95 are supplied with signals from terminal 91 through resistor 92. N-ch transistor 97 is connected to node 96 between transistors 94 and 95 and ground, and the gate of transistor 97 is also supplied with signal PT. Signals from node 96 are supplied to CMOS inverter 98. An output signal from inverter 98 is commonly supplied to CMOS inverters 99 and 100. Output signals from inverter 99 are supplied to another CMOS inverter 101. Output signals from inverter 101 and 100 are supplied to row decoder 32 as internal address signals Aj* and $\overline{Aj*}$, respectively. Note that sections for processing other row address bits are arranged similarly to the circuit shown in FIG. 3. Further, that section of a column address buffer which processes one column address bit is similar to the row address buffer section shown in FIG. 3 except that signal $\overline{CE^*}$ is supplied to the gates of transistors 93 and 97 instead of signal PT. Thus, the column address buffer section is controlled by external control signal $\overline{CE}$.

Figure 4:
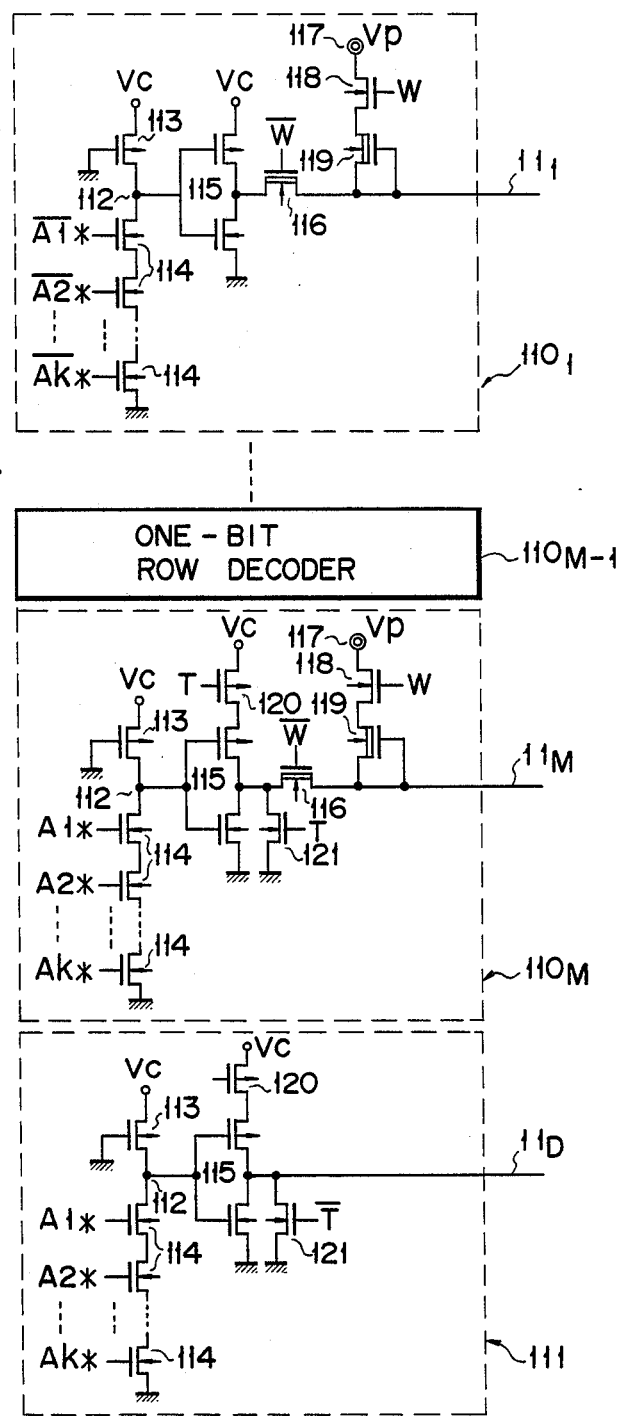
FIG. 4 is a circuit diagram of a row decoder of the memory device shown in FIG. 1.

FIG. 4 is a circuit diagram of an arrangement of row decoder 32. Decoder 32 has M row line driving circuits $110_1$ to $110_M$ respectively corresponding to lines $11_1$ to $11_M$ and dummy row line driving circuit 111. For example, driving circuit $110_1$ for activating line $11_1$ is arranged as follows. That is, P-ch transistor 113 is connected between terminal $V_C$ and node 112. The gate of transistor 113 is connected to the ground, so that transistor 113 is normally turned on. N-ch transistors 114 for decoding are connected in series between node 112 and ground. The number of N-ch transistors 114 correspond to the number of bits of the external row address signal. In the case of line $110_1$, the gates of transistors 114 are respectively supplied with internal row address signals $\overline{A1^*}$ to $\overline{Ak^*}$ (assuming that the number of bits of the external row address signal is k in this case) generated by buffer 34. Signals from node 112 are supplied to CMOS inverter 115. Depletion N-ch transistor 116 is connected between inverter 115 and line $11_1$, and the gate of transistor 116 is supplied with program control signal $\overline{W}$ from an external controller (not shown). Enhancement type N-ch transistor 118 and depletion type N-ch transistor 119 are connected in series between line $11_1$ and terminal 117 supplied with high voltage $V_p$ during data programming. The gate of transistor 118 is supplied with program control signal W from the eternal controller, and the gate of transistor 119 is connected to line $11_1$. Transistors 116, 118, and 119 constitute a program circuit for programming data in memory cells 12 connected to the corresponding lines. Other row line driving circuits for activating all other row lines except line $11_M$ have the same arrangement as described above except that a combination of the internal address signals supplied to the gates of transistors 114 is different from that of driving circuit $110_1$.

In addition, in driving circuit $110_M$ for activating line $11_M$, P-ch transistor 120 is connected between inverter 115 and terminal $V_C$ and receives signal T at its gate, and N-ch transistor 121 is connected between an output node of inverter 115 and ground and receives signal T at its gate. In the case of driving circuit $110_M$, the gates of transistors 114 are respectively supplied with signals A1* to Ak* generated by buffer 34.

Dummy row line driving circuit 111 for activating dummy row line $11_D$ is similar to driving circuit $110_M$ except that transistors 116, 118, and 119 for programming data are omitted, and signal $\overline{T}$ is supplied to the gates of P-ch transistor 120 and N-ch transistor 121. In the case of driving circuit 111, the gates of transistors 114 are respectively supplied with signals A1* to Ak* generated by buffer 34, similar to the case of driving circuit $110_M$.

An operation of the circuit having the above arrangement will be described below. First, a test operation of measuring the data readout rate of each memory cell 12 before data is programmed therein will be described. In this case, all cells 12 and dummy memory cell 13 are set in an erased state, i.e., a state wherein the threshold voltage is low. During the test, a high voltage of +12 V is normally supplied to terminal 41 of the circuit shown in FIG. 2. At this time, a potential of node 49 of high voltage detector 43 exceeds the circuit threshold voltage. Therefore, signal T becomes "1" level as shown in the timing chart of FIG. 5. Note that inverted signal $\overline{T}$ of signal T becomes "0" level (not shown). Thus, signal T is set at level "1" to set the test mode.

When signal $\overline{T}$ is set at level "0", P-ch transistor 59 connected between node 58 and terminal $V_C$ is turned on, and N-ch transistor 57 connected between node 58 and ground is turned off. Therefore, node 58 is set to be level "1" through transistor 59 regardless of external chip enable signal $\overline{CE}$. When node 58 is set at level "1", an output from inverter 60, i.e., internal chip enable signal $\overline{CE^*}$ is set at level "0". On the other hand, when signal $\overline{T}$ is set at level "0", P-ch transistor 1 connected between node 70 and terminal $V_C$ is turned on, and N-ch transistor 69 connected between node 70 and ground is turned off. Therefore, node 70 is set at level "1" through transistor 71 regardless of external output enable signal $\overline{OE}$. When node 70 is set at level "1", an output from inverter 72, i.e., internal output enable signal $\overline{OE^*}$ is set at level "0". Therefore, transistor 61 is turned on, transistor 65 is turned off, transistor 76 is turned on, transistor 78 is turned off, transistor 79 is turned off, and transistor 80 is turned on.

In this state, when signal $\overline{OE}$ of terminal 42 is set at level "0", P-ch transistor 62 is turned on to set the signal from node 64 at level "1". Therefore, the output signal from inverter 66 becomes "0" level. In addition, the following output signal from inverter 73 becomes "1" level. Therefore, P-ch transistor 74 is turned off, and N-ch transistor 75 is turned on. In this case, N-ch transistor 76 connected between node 77 and ground has been turned on by signal T beforehand, and P-ch transistor 78 connected between node 77 and terminal $V_C$ has been turned off by signal T beforehand. Therefore, the signal from node 77 is set at level "0". When the signal from node 77 is set at level "0", P-ch transistor 83 is turned on, and N-ch transistor 81 is turned off. In this case, P-ch transistor 79 has been turned off beforehand, and N-ch transistor 80 has been turned on beforehand, so that the signal from node 82, i.e., control signal PT is set at level "1". That is, if signal $O\overline{OE}$ is set at level "0" when signal $\overline{CE}$ is set at a high voltage of +12 V, signal PT becomes level "1", as shown in FIG. 5.

When signal $\overline{OE}$ becomes level "1" from this state, transistor 62 is turned off, and transistor 63 is turned on, so that the logic level of the signal from node 64 changes from level "1" to level "0". Therefore, the output signal from inverter 66 changes from level "0" to level "1", and the output signal from following inverter 73 changes from level "1" to level "0". When the output signal from inverter 73 changes to level "0", transistor 74 is turned on, transistor 75 is turned off, so that the signal from node 77 changes from level "0" to level "1". Therefore, transistor 81 is turned on and transistor 83 is turned off, so that signal PT changes from level "1" to level "0", as shown in FIG. 5.

Figure 5:
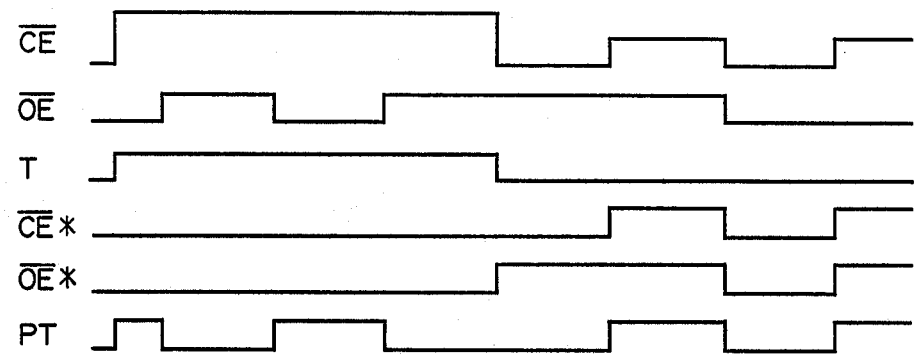
FIGS. 5 is a timing chart of signals for explaining an operation of the memory device shown in FIGS. 1 to 4.

When signal OE becomes level "0" from this state, signal PT changes from level "0" to level "1", as shown in FIG. 5.

On the other hand, in the address buffer shown in FIG. 3, P-ch transistor 93 is kept on and N-ch transistor 97 is kept off while signal PT is set at level "0", so that the signal from node 96 becomes equal to an inverted signal of input address signal Aj. Therefore, output address Aj* from inverter 101 becomes an in-phase signal of input address signal Aj, and output address $\overline{Aj}^*$ becomes equal an inverted phase signal of input address signal Aj. On the other hand, transistor 93 is turned off and transistor 97 is turned on when signal PT is set at level "1". Therefore, the signal from node 96 is set to level"0" regardless of input address signal Aj, address Aj* from inverter 101 is set to level "1", and address $\overline{Aj}^*$ from inverter 100 is set to level "0". This state similarly occurs in the other row address signals although not shown.

During the test wherein test mode signal T is set at level "1", in decoder 32 shown in FIG. 4, P-ch transistor 120 is turned off and N-ch transistor 121 is turned on in row line driving circuit $110_M$, so that the output signals from inverter 115 in driving circuit $110_M$ are set at level"0" regardless of signals Al* to Ak*. Since program control signal $\overline{W}$ is set at level "1" and transistor 116 is turned on when data programming is not effected, corresponding row line $11_M$ is set to level "0". On the other hand, transistor 120 is turned on and transistor 121 is turned off in driving circuit 111. As a result, in the test mode, driving circuit $110_M$ is disabled and driving circuit 111 is enabled. When signal PT becomes level "1", internal address signal Aj* becomes level "1" regardless of the external address signal as described above, so that K decoding transistors 114 in driving circuit 111 are all set in an on state. Therefore, the signal from node 112 becomes level "0", the output from inverter 115 becomes level "1", so that line $11_D$ is activated to be level "1". In addition, since at least one gate of transistors 114 of driving circuits $110_1$ to $110_{M-1}$ is supplied with signal $\overline{Aj}^*$ of level "0", the signal from node 112 becomes level "1", so that the output signal from inverter 115 becomes level "0". Therefore, lines $11_1$ to $11_{M-1}$ are all set to level "0".

Thus, in the test mode, when signal PT is set at level "1", only line $11_D$ is activated regardless of the external address signal.

When signal PT changes from level "1" to level "0" in the test mode, transistor 93 is turned on and transistor 97 is turned off in buffer 34 shown in FIG. 3, as described above, so that buffer 34 operates normally operates. That is, the signal from node 96 becomes an inverted signal of input address signal Aj. Therefore, address Aj* from inverter 101 becomes an in-phase signal of input address signal Aj, and address $\overline{Aj}^*$ from inverter 100 becomes an inverted phase signal of input address signal Aj. The signal from node 112 of one of driving circuits $110_1$ to $110_M$, whose transistors 114 are all turned on, becomes level "0", the signal from inverter 115 supplied with the above signal becomes level "1" in driving circuits $110_1$ to $110_{M-1}$ and a corresponding one of lines $11_1$ to $11_{M-1}$ is activated to be level "1". That is, when signal PT changes from level "1" to level "0", one of row lines $11_1$-$11_{M-1}$ corresponding the input address signal is selectively activated instead of line $11_D$. Note that when one of line $11_D$ and row lines $11_1$ to $11_{M-1}$ is selected in accordance with the decoded output from decoder 32, one of column line selecting transistors 17 is turned on in accordance with the decoded output from decoder 33, so that one of lines $15_1$ to $15_N$ connected thereto is selected.

When line $11_D$ is activated in the test mode as described above, dummy memory cell 13 connected to line $11_D$ is turned on. Therefore, dummy column line $15_D$ is discharged to a low level through cell 13. When line $15_D$ is discharged, node 24 is discharged, and a potential of node 24 is set to a low potential. On the other hand, since line $11_D$ is not connected to cell 12, line $11_D$ is set in a state equivalent to the state wherein a memory cell with a high threshold voltage is connected thereto. Therefore, one of lines $15_1$ to $15_N$ which is selected by decoder 33 is not discharged, and the potential of node 20 is set to be a high potential by transistor 28. That is, amplifier 30 reads out memory data from the memory cell in which data has been programmed, and detection data is at level "1".

When one of row lines which corresponds to the row address signal is activated, cells 12 connected to the row line are turned on. Therefore, lines $15_1$ to $15_N$ are respectively discharged through cells 12. Then, only one of lines $15_1$ to $15_N$, which is selected by decoder 33 according to the column address signal, is connected to node 20, and a potential of node 20 is set to a low potential. On the other hand, cell 13 connected to the activated row line is turned on as described above, line $15_D$ is discharged through cell 13, node 24 is discharged, and a potential of node 24 is set to a low potential. That is, amplifier 30 reads out memory data of cell 12 in a data-erased state, and detection data is set at level "0". Note that although both nodes 20 and 24 are discharged to have a low potential, the resistance of transistor 28 is higher than that of transistor 29 and the potential of node 20 is set lower than that of node 24. Therefore, amplifier 30 can detect data of level "0".

Figure 6:
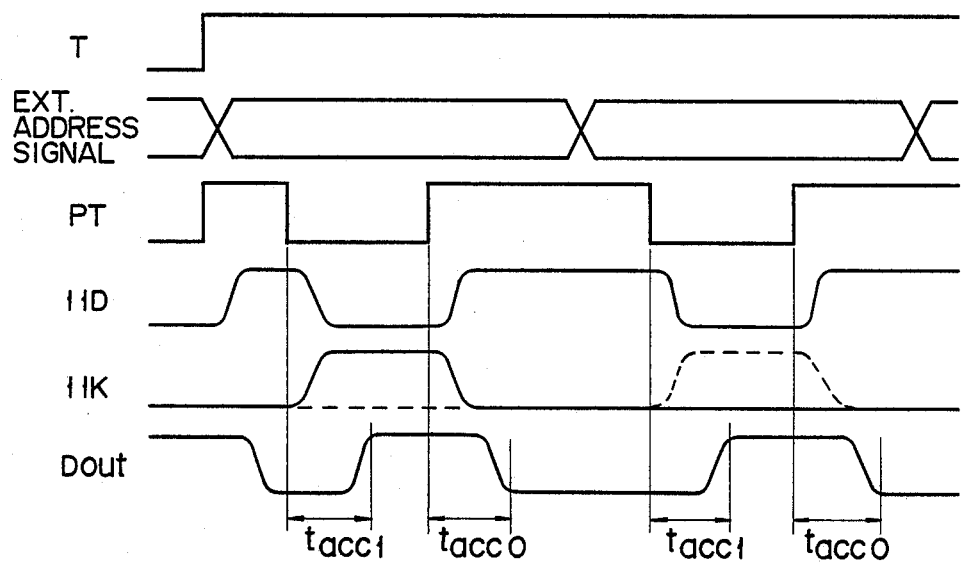
FIG. 6 is a timing chart further explaining an operation of the memory device shown in FIGS. 1 to 4.

As described above, signal PT is set to level "1" to select line $11_D$, and then signal PT is set to level "0" to select one of lines $11_1$ to $11_{M-1}$. This means that the memory cell in the programmed state is selected and then the memory cell in the erased state is selected. Therefore, as shown in the timing chart of FIG. 6, whenever the external address signal is sequentially updated, signal PT is set to level "1" to activate line $11_D$ and then set to level"0" to activate line $11_K$ corresponding to the external address signal, so that memory data of the memory cell in the erased state is readout. In this case, the data readout rate of each cell 12 corresponds to time taccl wherein signal PT becomes level "0", line $11_K$ corresponding to the external address signal is activated, and memory data of the memory cell in the erased state is read out to one of lines $15_1$ to $15_N$, which is detected by amplifier 30 and is then output from buffer 31.

Similarly, signal PT is set to level"0" to select one of row lines $11_1$ to $11_{M-1}$, and then signal PT is set to level "1" to select line $11_D$, thereby equivalently selecting the memory cell in the programmed state after selecting the memory cell in the erased state. In this case, the data readout rate corresponds to a time interval tacc0 wherein signal PT becomes level "1", none of lines $11_1$ to $11_M$ are selected, and potentials of lines $15_1$ to $15_N$ are increased, detected by amplifier 30, and then output from buffer 31 as signal Dout. Therefore, the data readout rate of cell 12 can be measured by measuring time taccl and tacc0. Such measurement is performed for all cells connected to row lines except line $11_M$ by updating the external address signal.

Note that in the above embodiment, the data read rate of cell 12 is defined by the time interval wherein line $11_K$ is selected or not selected and, then data is output from buffer 31. When integrating such a memory, since each of lines $11_1$ to $11_M$ is made, of polycrystalline silicon, the wiring resistance of each line is relatively high, and the parasitic capacitance is also high. On the other hand, when of each transistor 17 is gate wired, a decode output line of decoder 33 is made of aluminum with a relatively low resistance. For this reason, a time required for selecting lines $11_1$ to $11_M$ and occupying part of the data readout time is longer than a time required for selecting transistors 17. Therefore, measurement of the data readout rate may be defined to be equivalent to the time starting from switching of lines $11_1$ to $11_M$. In addition, gates of cells 12 preferably operate as if connected to line $11_D$ by a line having a number corresponding to that connected to each one of lines $11_1$ to $11_M$, as will be described later. With this arrangement, times required for charging and discharging line $11_D$ and lines $11_1$ to $11_M$ are set equal to each other, so that the readout rate can be measured more accurately.

As described above, in the memory cell of the above embodiment, the data readout rate of the memory cell can be measured without programming data in the memory cell. Therefore, in the case of a one-time PROM, since the readout rate can be measured after the memory chip is sealed into the package, defectives can be detected at a rated readout rate without establishing an additional margin for error. As a result, yield of the products can be improved to reduce manufacturing cost. In addition, since the readout rate can be measured after the memory chip is sealed into the package, memory chips damaged during packaging can be eliminated.

A normal data readout operation after data is programmed will be described below. During this normal operation, terminal 41 of the circuit shown in FIG. 2 is supplied with signal $\overline{CE}$ 0f $+5$ V or 0 V (a ground voltage). At this time, a potential of node 49 in high voltage detector 43 is normally below the circuit threshold voltage of inverter 50. Therefore, signal T becomes level "0" as shown in the timing chart of FIG. 5.

When signal T is set at level "0", i.e., signal $\overline{T}$ is set at level "1", N-ch transistor 57 connected between node 58 and ground is turned on, and P-ch transistor 59 connected between node 58 and power supply terminal $V_C$ is turned off. For this reason, the signal from node 58 becomes the inverted level of external chip enable signal $\overline{CE}$. Therefore, the output from inverter 60, i.e., internal chip enable signal $\overline{CE^*}$ becomes the same level as that of signal $\overline{CE}$.

On the other hand, when signal T is set at level "0", N-ch transistor 69 connected between node 70 and ground is turned on, and P-ch transistor 71 connected between node 70 and terminal $V_C$ is turned off. Therefore, the output from node 70 goes to inverted level of the output signal from inverter 66. In addition, P-ch transistor 61 connected between node 64 and terminal $V_C$ is turned on when signal $\overline{CE}$ becomes level "0" and signal $\overline{CE^*}$ is set at level "0", and N-ch transistor 65 is turned off when signal $\overline{CE^*}$ is set at level "0". For this reason, internal output enable signal $OE^*$ becomes level "0" only when both signal $\overline{CE}$ and external output enable signal $\overline{OE}$ are set at level "0". Sense amplifier 30 operates when signal $CE^*$ is set at level "0", and output buffer 31 operates when signal $\overline{OE^*}$ and $\overline{CE^*}$ are set at level "0".

When signal T is set at level "0", N-ch transistor 76 is turned off and P-ch transistor 78 is turned on in the circuit shown in FIG. 2, so that N-ch transistor 81 connected between node 82 and ground is turned on and P-ch transistor 83 connected between node 82 and terminal $V_C$ is turned off. Therefore, the signal from node 82, i.e., signal PT becomes the same level as that of signal $\overline{CE^*}$.

In this case, amplifier 30 and buffer 31 do not operate when signal $CE^*$ is at level "1", and buffer 31 does not operate when signal $\overline{OE^*}$ is at level "1". In addition, when signal PT of the same level as that of signal $\overline{CE^*}$ is at level "1", P-ch transistor 93 is turned off and N-ch transistor 97 is turned on in the circuit shown in FIG. 3, so that row address buffer 34 does not operate either. In this case, signal $\overline{CE^*}$ in phase with signal PT is supplied to the column address buffer and it does not operate. That is, a time interval wherein signal $\overline{CE}$ is at level "1" in FIG. 5 corresponds to a standby interval, thereby reducing power consumption of the entire memory.

On the other hand, when both signals $\overline{CE^*}$ and $\overline{OE^*}$ are at level "0", row address buffer 34 shown in FIG. 3 operates to generate internal address signals $Aj^*$ and $\overline{AJ^*}$ corresponding to the external address signals. In row decoder 32 shown in FIG. 4, the output from one of row line driving circuits $110_1$ to $110_M$ becomes level "1" in accordance with the current address signal, and one of row lines $11_1$ to $11_M$ which is connected to the row line driving circuit is selectively activated. When one of lines $11_1$ to $11_M$ is activated, memory cell 12 connected to the activated row line is activated. In addition, one of column lines $15_1$ to $15_N$ is selected in accordance with the decoded output from column decoder 33, and memory data of cell 12 located at the intersection of this column line and the above selected row line is read out to the selected column line. Assuming that cell 12 is in the erased state, cell 12 is turned on because its threshold voltage is low, and a potential of node 20 is set to a low potential. On the other hand, dummy memory cell 13 connected to this row line is also turned on, dummy row line $15_D$ is discharged to be low level through cell 13, and the potential of node 24 is also set to a low potential. At this time, since the resistance of load transistor 28 is set higher than that of transistor 29 and the potential of node 20 is set lower than that of node 24, this potential difference is amplified by amplifier 30, and memory data of cell 12 in the erased state is read out.

When data is programmed in cell 12 located at the intersection of a selected one of lines $15_1$ to $15_N$ and a selected one of lines $11_1$ to $11_M$, cell 12 is not turned on because its threshold voltage is high. Therefore, the potential of node 20 is set to a high potential. Then, a potential difference between the high potential of node 20 and a potential of node 24 set to a low potential by cell 13 is amplified by amplifier 30, and memory data in cell 12 in the programmed state is read out.

Note that in the above embodiment, the memory cells are not connected to line $11_D$ but a state is so set as to be equivalent to the state wherein the memory cells with high threshold voltage Vth in the programmed state are connected to line $11_D$. However, dummy memory cells in which data is programmed may be connected to line $11_D$ and the respective drains may be connected to corresponding lines $15_1$ to $15_N$. Alternatively, the memory cells in the erased state may be connected to line $11_D$, and the respective drains may not be connected to lines 15 to obtain the same effect as described above.

In addition, in the above embodiment, line $11_M$ cannot be selected in the test mode. This is because row line driving circuit 111 uses the same address signal as that used by row line driving circuit $110_M$. For this reason, the data readout time of cells 12 connected to line $11_M$ cannot be measured. However, one row line $11_M$ of M row lines is rarely defective, so that no problem will be posed. When cells 12 connected to line $11_M$ are to be measured, a dummy row line driving circuit and a dummy row line supplied with an address signal different from that supplied to row line driving circuit $110_M$ are provided to operate driving circuit $110_M$, thereby measuring the data readout time of the memory cells connected thereto.

Figure 7:
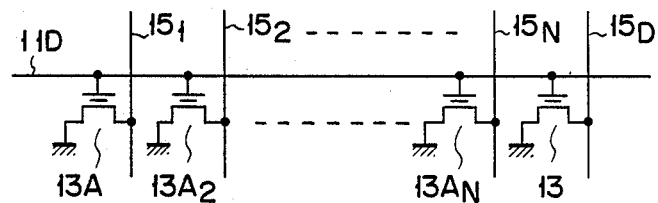
FIG. 7 is a circuit diagram of a modification of a dummy row line.

FIG. 7 is a circuit diagram showing an arrangement of dummy row line $11_D$ according to another embodiment of the present invention. In the memory of this embodiment, dummy memory cells $13A_1$ to $13A_N$ in the erased state in addition to dummy memory cells 13 are connected to line $11_D$, and the drains of cells $13A_1$ to $13A_N$ are respectively connected to column lines $15_1$ to $15_N$.

A4 driving circuit 111A, a program circuit constituted by transistors 116, 118, and 119 in each of row line driving circuits $110_1$ to $110_M$ of FIG. 4 is added to dummy row line driving circuit 111 of FIG. 4.

Figure 8:
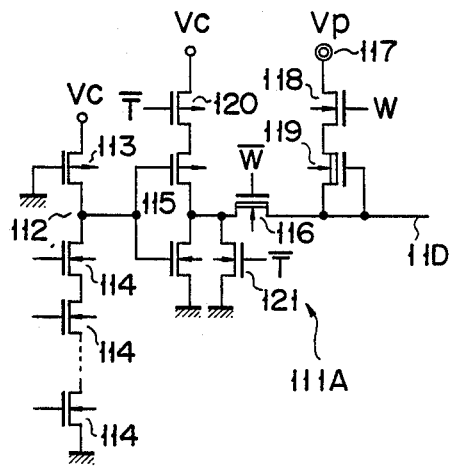
FIG. 8 is a circuit diagram of a modification of part of the row decoder shown in FIG. 4.

According to the memory of the embodiment of FIGS. 7 and 8, before the data readout time is measured, a high voltage of +12 V is supplied to terminal 41 to set the test mode, and data is programmed in cells $13A_1$ to $13A_N$ in the erased state by driving circuit 111A. With this arrangement, whether the program circuit operates normally can be checked.

Figure 9:
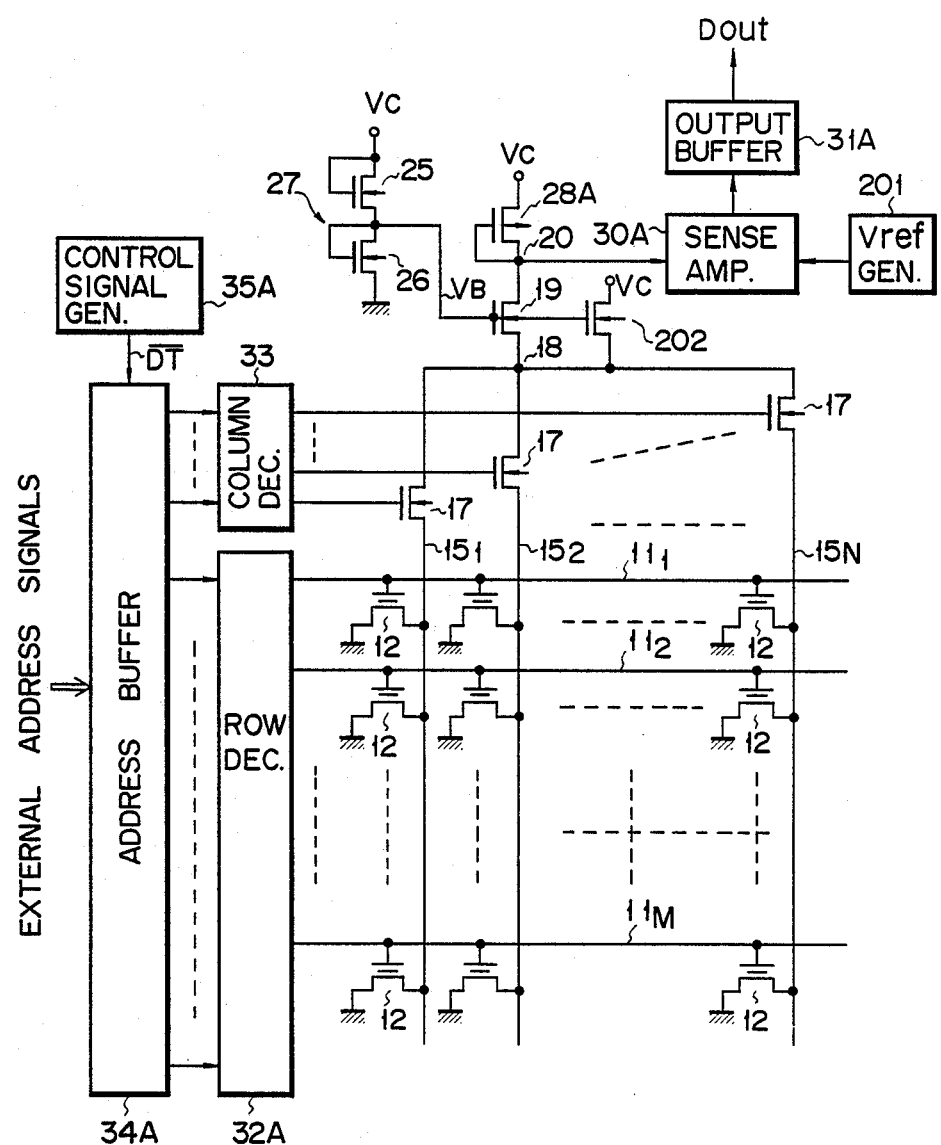
FIG. 9 is a circuit diagram of a nonvolatile memory device according to another embodiment of the present invention.

FIG. 9 shows a nonvolatile semiconductor memory device according to still another embodiment to the present invention. This memory device is arranged substantially the same as that shown in FIG. 1 except that dummy row line $11_D$, dummy column line $15_D$, dummy memory cells 13, and MOS transistors 21, 23, and 29 are omitted and reference voltage generator 201 is used. Additionally decoder 32A, address buffer 34A, and control signal generator 35A are used instead of row decoder 32, address buffer 34, and interface circuit 35. Furthermore, in this memory device, E-type P-ch transistor 28A is used instead of D-type N-ch transistor 28, and E-type N-ch transistor 202, the gate of which is connected to the output terminal of bias voltage generating circuit 7, is connected between power supply terminal $V_C$ and node 18.

Similarly, as has been described with reference to FIG. 1, the readout rate, which is measured when the memory cell in the erased state is selected after the memory cell in the programmed state is selected, can be measured by supplying a predetermined row address signal not associated with an external address signal from buffer 34A to decoder 32A to set all row lines $11_1$ to $11_M$ in a nonselected state, and then supplying the row address signal corresponding to the external address signal from buffer 34A to decoder 32A to select corresponding one of memory cells 12.

In addition, the readout rate, which is measured when the memory in the programmed state is selected after the memory cell in the erased state is selected, can be measured by selecting and turning on one of cells 12 designated in accordance with the external address, by supplying the row address signals not associated with the external address signal to decoder 32A, and by setting all the row selection signals on lines 111 to $11_M$ at a low level.

Figure 11:
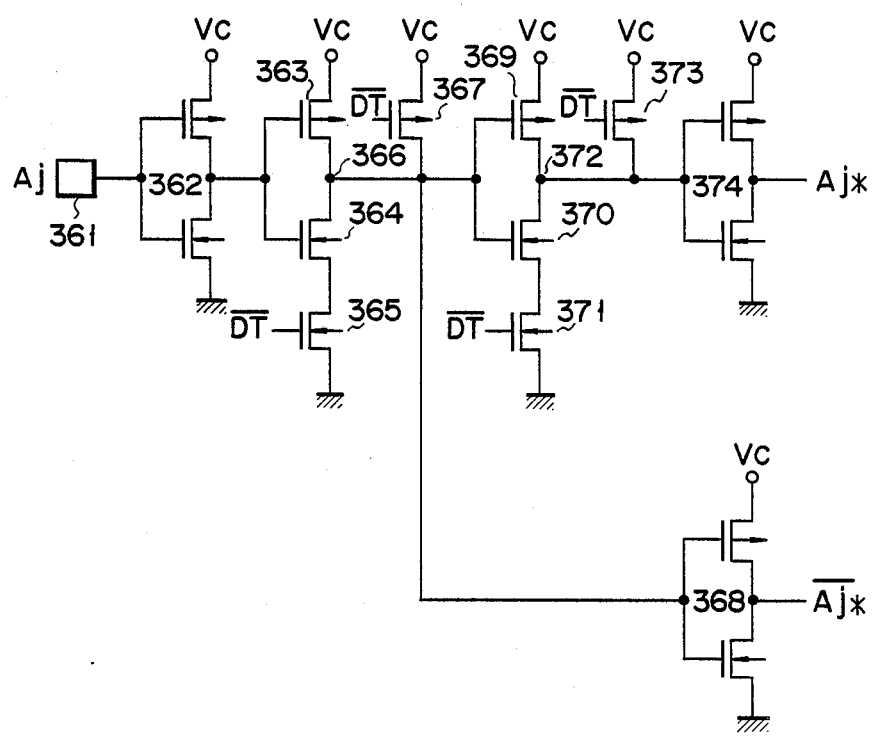
FIG. 11 is a circuit diagram of part of an address buffer of the memory device shown in FIG. 9.

When control signal generator 35A detects that the external signal is at a high voltage level indicating the test mode, generator 35A supplies detection signal $\overline{DT}$ of level "0" to a row address buffer shown in FIG. 11.

Figure 10:
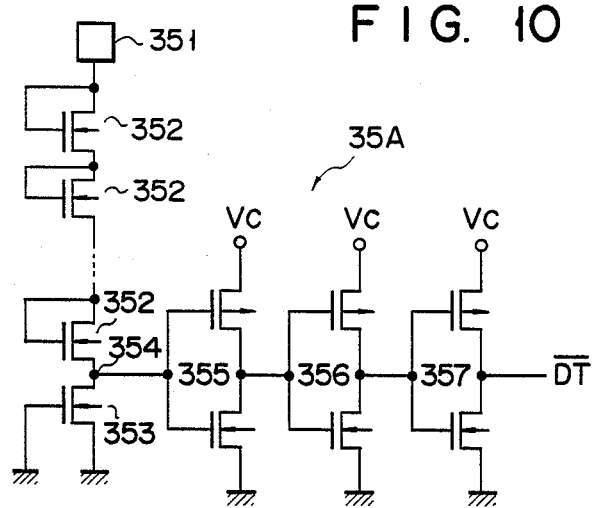
FIG. 10 is a circuit diagram of a control signal generator of the memory device shown in FIG. 9.

FIG. 10 is a circuit diagram of control signal generator 35A. Generator 35A receives a predetermined bit signal of external row address signals at its external terminal 351. A plurality of E-type N-ch transistors 352 and a D-type N-ch transistor 353 are connected in series between terminal 351 and ground. The gate of each transistor 352 is connected to the drain thereof, and the gate of transistor 353 is grounded. Node 354 between transistor 352 and transistor 353 is connected to the first stage of three cascade-connected CMOS inverters 355 to 357, i.e., inverter 355.

The threshold voltage, the number, and the like of transistors 352 are set so that when an external address signal having an amplitude between 0 V (the ground potential) and +5 V is supplied to terminal 351, a potential of node 354 is reduced (e.g., +1 V) below the circuit threshold voltage of inverter 355, and that when a high voltage of, e.g., +12 V, higher than power supply voltage $V_C$ is supplied to terminal 351, the potential of node 354 is increased (e.g., +2 V) over the circuit threshold voltage of inverter 355. Therefore, when a voltage of +5 V or the ground potential is supplied to terminal 351, an output signal from inverter 355 is set to be level "1", thereby setting output signal $\overline{DT}$ from inverter 357 at level "1". When a high voltage of +12 V is supplied to terminal 351, the output signal from inverter 355 is set to level "0", thereby setting signal $\overline{DT}$ from inverter 357 at level "0".

FIG. 11 is a circuit diagram of buffer 34A for generating an internal row address signal on the basis of an external row address signal, in which only a section for processing the external row address signal of one bit is shown. Terminal 361 is an external terminal supplied with 1-bit external address signal Aj. External address signal Aj supplied to terminal 361 is supplied to CMOS inverter 362. P-ch transistor 363 and two N-ch transistors 364 and 365 are connected in series between terminal $V_C$ and ground. Gates of transistors 363 and 364 are supplied with output signals from inverter 362, and the gate of transistor 365 is supplied with signal $\overline{DT}$ generated by control signal generator 35A. P-ch transistor 367 is connected to connecting node 366 between transistors 363 and 364 and to power source terminal $V_C$, and the gate of transistor 367 is also supplied with signal $\overline{DT}$. In addition, signals from node 366 are supplied to CMOS inverter 368. P-ch transistor 369 and two N-ch transistors 370 and 371 are connected in series between power source terminal $V_C$ and ground. The gates of transistors 369 and 370 are supplied with signals from node 366, and the gate of transistor 371 is supplied with signal $\overline{DT}$. P-ch transistor 373 is connected to connecting node 372 between transistors 369 and 370 and to power source terminal $V_C$, and the gate of transistor 373 is also supplied with signal $\overline{DT}$. Signals from node 372 are supplied to CMOS inverter 374. Output signals from inverters 374 and 368 are supplied to decoder 32A as internal address signal Aj* and internal address signal $\overline{AJ^*}$, respectively. A circuit provided in address buffer 34A to process a column address signal is similar to the circuit shown in FIG. 11 for processing a row address signal except that transistors 365, 367, 371 and 373 are omitted. Such a circuit functions to generate internal column address signals to select one of the column lines in response to an external address signal.

Decoder 32A has M row line driving circuits, each arranged and operating similarly to row line driving circuit $110_1$ shown in FIG. 4. The respective row line driving circuits selectively activate lines $11_1$ to $11_M$ in response to internal address signals having combinations different from each other.

An operation of the circuit having the above arrangement will be described below. First, an operation for measuring the data readout rate before data is programmed in each cell 12 will be described. In this case, all cells 12 are in the erased state, i.e., a state in which threshold voltage Vth is low. A high voltage of +12 V, higher than power source voltage $V_C$, is applied to terminal 351 of control signal generator 35A shown in FIG. 10. At this time, a potential of node 354 in generator 35A becomes +2 V, which is higher than the circuit threshold voltage of inverter 355. Therefore, the output signal from inverter 355 becomes level "0", the output signal from inverter 356 becomes level "1", and the output signal from inverter 357, i.e., signal $\overline{DT}$ becomes level "0".

When signal $\overline{DT}$ is set at level "0" as described above, in the 1-bit row address buffer shown in FIG. 11, transistor 367 connected between node 366 and power source terminal $V_C$ is turned on, and transistor 365 connected between node 366 and the ground terminal is turned off. For this reason, node 366 is set to level "1" through transistor 367 regardless of input address signal Aj. When node 366 is set at level "1", the output from inverter 368, i.e., signal AJ*, is set to level "0". On the other hand, when signal $\overline{DT}$ is set at level "0", transistor 373 connected between node 372 and power source terminal $V_C$ is turned on, and transistor 371 connected between node 372 and the ground terminal is turned off. Therefore, node 372 is also set to level "1" via transistor 373, and the output from inverter 374 supplied with signals from inverter 372, i.e., signal Aj*, is set to level "0". That is, as shown in the timing chart of FIG. 12, when terminal 351 is set at a high voltage of +12 V and generator 35A generates signal $\overline{DT}$ of level "0" in accordance therewith, both outputs Aj* an $\overline{Aj*}$ from the row address buffer shown in FIG. 11 are set to level "0" regardless of input address signal Aj.

In this case, in each row line driving circuit of decoder 32A, all decoding N-ch transistors 114 (FIG. 4) are turned off, and the signal from node 112 is set to level "1" by P-ch transistor 113. Therefore, the output signal from inverter 115 becomes level "0". In a write-in circuit constituted by transistors 116, 118, and 119, programming control signals W and $\overline{W}$ are respectively set to levels "0" and "1", transistor 118 is turned off, and transistor 116 is turned on, so that the output signal from inverter 115 sets the potential of the corresponding line to be level "0". That is, this line i the nonselected state. For this reason, all lines $11_1$ to $11_M$ shown in FIG. 9 are set in the nonselected state, and none of cells 12 connected to the respective row lines are activated, thus permitting node 18 to be charged. In this case, bias voltage $V_B$ is so set that N-ch transistors 19 and 202 are turned off when potential V18 of node 18 becomes, e.g., 1.2 V. Therefore, node 20 is charged to a high potential of, e.g., 4 V, by transistor 28A. Since predetermined reference potential Vref is output from reference potential generator 201, sense amplifier 30A amplifies a difference between both input voltages to detect data. In this case, since the potential of node 20 is high, amplifier 30A detects data of level "1", and this data is output through buffer 31A as output data Dout at level "0". Readout data Dout corresponds to memory data of the memory cell in which data is programmed.

Figure 12:
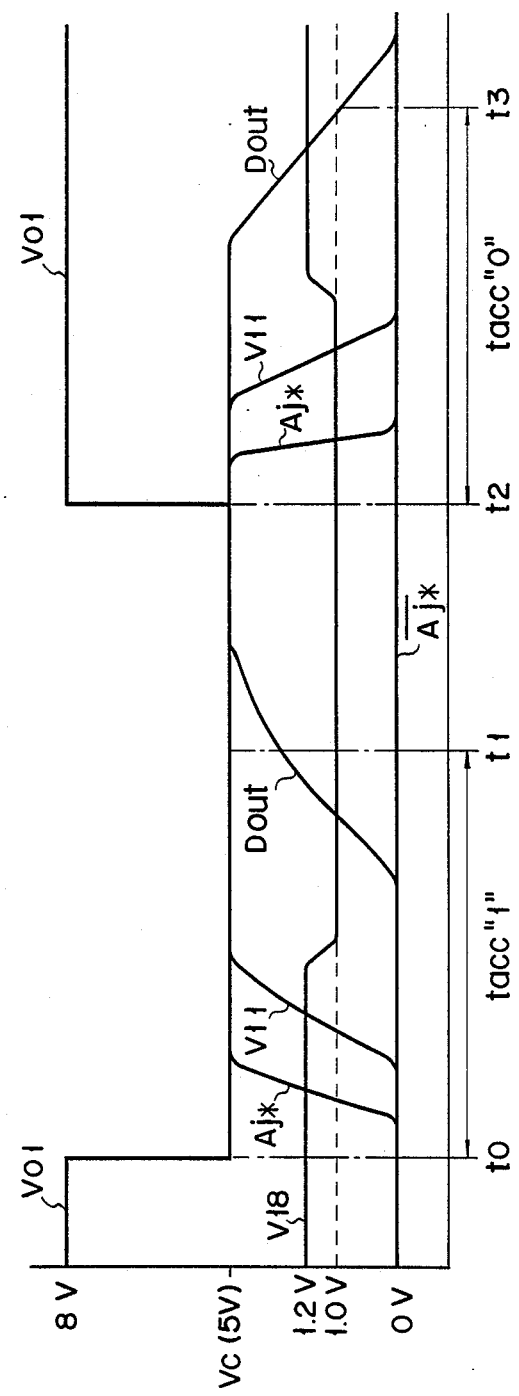
FIG. 12 is a timing chart of signals for explaining an operation of the memory device shown in FIGS. 9 to 11.

Then, voltage V01 at terminal 351 is changed from +12 V to the voltage level (not higher than power source voltage $V_C$) of a normal external address signal. Assume 25 that the external address signal of level "1" ($V_C$) is supplied to terminal 351 as shown in FIG. 12. At this time, the potential of node 354 in control signal generator 35A becomes +1 V which is below the circuit threshold voltage of inverter 355. Therefore, the output signal from inverter 355 becomes level "1", the output signal from inverter 356 becomes level "0", and the output signal from inverter 357, i.e., signal $\overline{DT}$ becomes level "1".

When signal $\overline{DT}$ is set at level "1", as described above, in the 1-bit row address buffer shown in FIG. 11, transistor 367 is turned off, transistor 365 is turned on, transistor 373 is turned off, and transistor 371 is turned on. For this reason, signals from node 366 are set in accordance with input address signal Aj, and signals from node 372 are set in accordance with the signals from node 366. If input address signal Aj is set at level "1", signal $\overline{Aj*}$ is also set to level "1", and signal Aj* is set to level "0", as shown in FIG. 12. Therefore, address buffer 34A of FIG. 9 generates the internal address signals in accordance with the external address signals.

In decoder 32A in which each row line driving circuit is arranged similarly to row line driving circuit $110_1$ shown in FIG. 4, a signal of level "1" is supplied to only the row line connected to the row line driving circuit wherein all transistors 114 are turned on in accordance with the currently supplied internal address signal. That is, in the row line driving circuit wherein all transistors 114 are turned on, node 112 is discharged to level "0", thereby setting the output signal from inverter 115 to level "1". At this time, write-in control signals W and $\overline{W}$ are respectively set to levels "0" and "1" in the write-in circuit (not shown), transistor 118 is turned off, and transistor 116 is turned on, so that the row line corresponding to inverter 115 is charged to level "1" in accordance with the signal therefrom. Assuming that line $11_1$ is selected, potential V11 of line $11_1$ is gradually increased as shown in FIG. 12. When potential V11 of selected line $11_1$ is sufficiently increased, cell 12 connected to line $11_1$ is activated.

On the other hand, in accordance with the internal address signal generated by buffer 34A, one of transistors 17 is turned on in response to the decoded output from the column decoder 33, and one of column lines connected to selected transistor 17 is selected. For this reason, one cell 12 arranged at the intersection of selected line $11_1$ and the column line is selected. Since data is not programmed in each cell 12 and its threshold voltage Vth is low, selected cell 12 is turned on, and node 18 is discharged. When potential V18 of node 18 becomes lower than 1.2 V, a potential difference between the gates of transistors 19 and 202 and node 18 exceeds the threshold voltages of transistors 19 and 202, so that transistors 19 and 202 are turned on. In this case, the On-resistance of P-ch transistor 28A and N-ch transistors 202 and 19 are so determined that the potential at node 18 becomes, for example, 1 V. Therefore, the potential at node 20 is reduced from 4 V, and since the potential at node 20 is lowered below potential Vref, amplifier 30A detects data of level "0", and this data is output through buffer 31A as output data Dout at level "1". That is, data is not programmed in this case, and memory data of the memory cell in the erased state is read out.

More specifically, in the memory device according to the above embodiment, voltage V01 of terminal 351 is set to be a high voltage so as to set all lines $11_1$ to $11_M$ in the nonselected state to read out memory data from the memory cell in the programmed state. Next, predetermined external row address signals, instead of the high voltage, are supplied to terminal 351 so as to selectively activate one of the row lines corresponding to the address to read out data from cell 12 in the erased state. In this case, the data readout rate of reading out data from memory cell 12 in the erased state corresponds to time tacc "1" from the timing when potential V01 of terminal 351 is reduced to a normal voltage of +5 V or 0 V at time t0 of FIG. 12. An internal address signal corresponding to the external row address signal is set to activate the low line when memory data of the memory cell in the erased state is read out to the column line, detected by amplifier 30A, and output from address buffer 31A at time t1. The data readout rate of reading out data from a memory cell in the programmed state corresponds time tacc "0" from the time t2 to time t3 shown in FIG. 12.

When potential V01 of terminal 351 is changed to a high voltage of +12 V at time t2 in FIG. 12, internal address signals Aj* and $\overline{Aj^*}$ become level "0" irrespective of the external row address signal, and all lines $11_1$ to $11_M$ are set in the non-selected state. For this reason, column lines are set at the same potential as that obtained in a case where the memory cell in the programmed state is selected, and this potential is detected by amplifier 30A as data "1" level, so that level "0" is output from buffer 31A at time t3. If terminal 351 of control signal generating circuit 35A and terminal 361 of the row address buffer are connected together and control signal generating circuit 35A and the row address buffer are arranged close to each other, the time after potential V01 of terminal 351 is changed, until control signal $\overline{DT}$ is changed becomes as short as negligible, i.e., several nsec or less.

Further, by increasing dimensions of inverters 355, 356, and 357, a time required for changing signal $\overline{DT}$ can be further shortened. A time required for a normal readout operation, i.e., a time interval between the timing when the address signal is changed, and the timing when the output signal is changed is normally approximately 200 nsec. As compared with this value, a time required for changing signal $\overline{DT}$ in control signal generating circuit 35A is very short.

Therefore, by measuring times tacc "1" and tacc "0" as mentioned above, the data readout rate of cell in the erased state in OTP sealed in a package 12 can be measured without data programming. Such measurement is performed for all row lines $11_1$ to $11_M$ by changing the external address signals.

The above embodiment has the same effects as the embodiment described with reference to FIGS. 1 to 6.

When data is programmed and then read out from the memory device, one of row lines $11_1$ to $11_M$ and one of column lines $15_1$ to $15_M$ are selected in accordance with the external address signal, potentials of nodes 18 and 20 are set in accordance with one cell 12 arranged at the intersection of the selected row and column lines, and amplifier 30A detects data in accordance with the difference between potential of node 20 and potential Vref.

Figure 13:
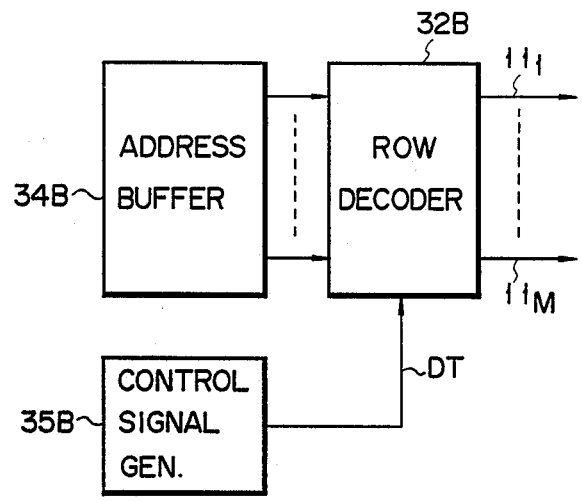
FIG. 13 is a block diagram of a nonvolatile memory device according to still another embodiment of the present invention.

FIG. 13 is a block diagram showing an arrangement of still another embodiment of the present invention. The memory device according to this embodiment is arranged such that when a high voltage is applied to control signal generator 35B, generator 35B generates detection signal DT of level "1". Signal DT is supplied to row decoder 32B instead of address buffer 34B.

Figure 14:
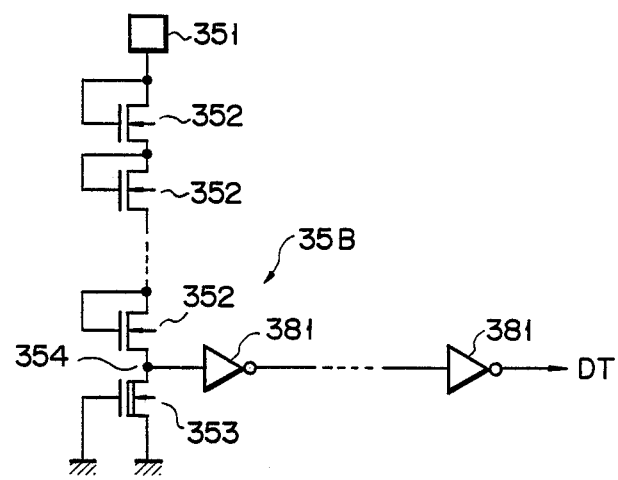
FIG. 14 is a circuit diagram of a control signal generator of the memory device shown in FIG. 13.

FIG. 14 is a circuit diagram showing a detailed arrangement of control signal generator 35B of the memory device according to the embodiment of FIG. 13. A difference between control signal generator 35B and that shown in FIG. 10 is that CMOS inverters 381 are connected in series to node 354 and an even number of inverters 381 are used in this case. For this reason, when a high voltage of +12 V is supplied to terminal 351 of circuit shown in FIG. 14, signal DT becomes level "1".

Figure 15:
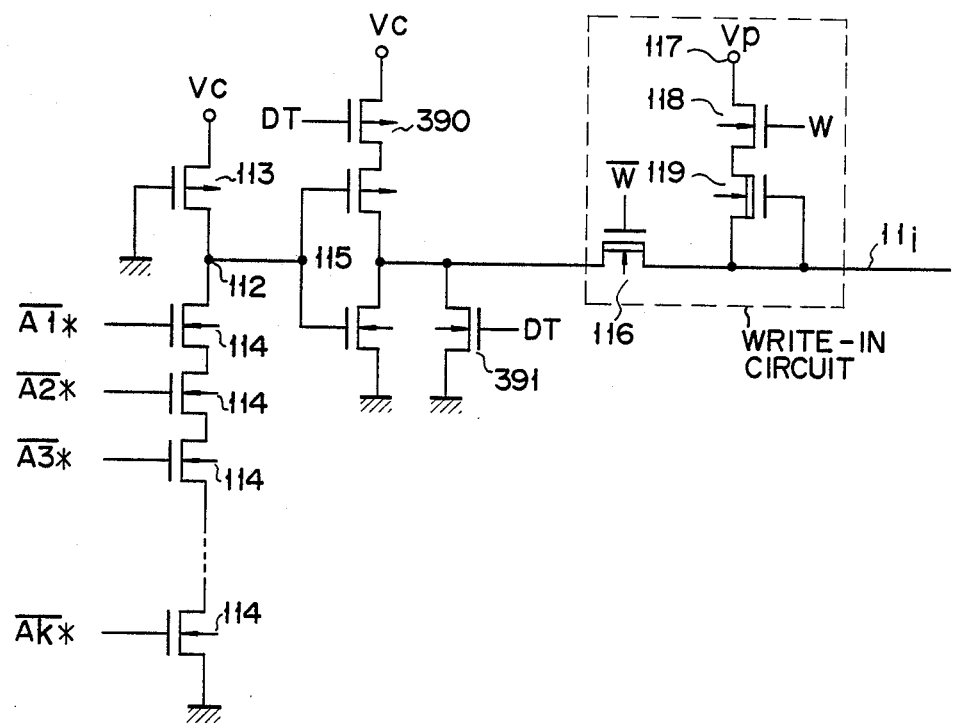
FIG. 15 is a circuit diagram of part of a row decoder of the memory device shown in FIG. 13.

FIG. 15 is a circuit diagram showing a detailed arrangement of row line driving circuit of the memory device according to the embodiment shown in FIG. 13. A difference between this row line driving circuit and row line driving circuit $110_1$ shown in FIG. 4 is that an additional P-ch transistor 390 is connected between the source of the P-ch transistor of inverter 115 and power supply terminal $V_C$, and that an additional N-ch transistor 391 is connected between the output node of inverter 115 and ground. Gates of transistors 390 and 391 are supplied with signal DT from control signal generator 35B shown in FIG. 14.

Note that address buffer 34B in the memory device according to this embodiment is the same as the address buffer of FIG. 11 except that all transistors 365, 367, 371, and 373 are omitted, and whenever buffer 35B is supplied with external address signals, buffer 35B generates internal address signals in response to the external address signals.

In the memory device of this embodiment, terminal 351 of control signal generator 35B is supplied with a high voltage. When signal DT becomes level "1", transistor 390 is turned off and transistor 391 is turned on in the row line driving circuit of FIG. 15, so that row line $11_i$ is set in the nonselected state. When terminal 351 is supplied with normal external address signals and signal DT becomes level "0", transistor 390 is turned on and transistor 391 is turned off, so that the row line driving circuit of FIG. 15 performs a decoding operation in accordance with the internal address signals. Therefore, the data readout time of the memory of this embodiment can be measured by supplying the high voltage to terminal 351.

As has been described above, according to the present invention, there is provided a nonvolatile semiconductor memory device which can be manufactured at low cost. The electrical characteristics of this device can be measured after the memory device is sealed into a package even in a case where the device is formed to permit data to be programmed only once and to prevent the programmed data from being erased.

Especially in the embodiments shown in FIGS. 1 to 4 and FIGS. 9 to 11, since control signal PT or $\overline{DT}$ from interface circuit 35 or control signal generator 35A is directly supplied to address buffer 34 or 34A, the delay time of buffer 34 or 34A is also included in the data readout time, thereby accurately measuring the readout rate.

The present invention has been described with reference to the preferred embodiments, but the present invention is not limited to the above embodiments. For example, in the embodiment shown in FIGS. 9 to 11, dummy row line $11_D$, dummy column line $15_D$, and dummy memory cell 13 may be used as in the embodiment shown in FIGS. 1 to 4.

What is claimed is:

1. A nonvolatile semiconductor memory device receiving an external column and row address signal that designate a row and a column, comprising:
- a memory cell array for storing data, including a plurality of memory cells arranged in rows and columns, each memory cell including a nonvolatile transistor;
- a plurality of row lines, each connected to those of said memory cells arranged on a corresponding row;
- a plurality of column lines, each connected to those of said memory cells arranged on a corresponding column;
- column line select transistors for selecting a one of said plurality of column lines;
- column address buffer means for outputting internal column address signals of a selected memory cell in response to received external column address signals;
- column decoding means for selectively biasing said column line select transistors to select said column line of said selected memory cell in response to said internal column address signals;
- row address buffer means for outputting internal row address signals in response to received external row address signals;
- row decoding means for selectively biasing a row line in response to said internal row address signals;
- control means, operative in a first and second mode, for controlling said row address buffer means by setting said internal row address signals in a predetermined state to hold said row lines in a nonselected state,
- wherein, when said control means is in said first mode, said selected column line is set to a first potential and said internal row address signals are set to said predetermined state in response to said received external row address signals, and
- wherein, when said control means is in said second mode, said selected column line is set to one of said first potential and a second potential corresponding to data stored in said selected memory cell; and
- sensing means for detecting the potential of said selected column line and for supplying an output signal to an external terminal in response thereto when said control means is in said first and second modes.

2. A nonvolatile semiconductor memory device according to claim 1,
- wherein an external power source supplies an external power signal having a power source voltage to said control means,
- wherein said control means is in said first mode when a voltage of a predetermined external input signal is at least equal to a predetermined voltage greater than said power source voltage, and
- wherein said control means is in said second mode when the voltage of said external input signal is smaller than said predetermined voltage.

3. A nonvolatile semiconductor memory device according to claim 2, wherein said predetermined external input signal is one of said external row address signals.

4. A nonvolatile semiconductor memory device according to claim 1, wherein said sensing means includes reference potential generating means for generating a reference potential, and wherein said sensing means supplies said output signal in response to a comparison between the potential of said selected column line and said generated reference potential.

5. A nonvolatile semiconductor memory device receiving external column address signals and external row address signals, comprising:
- a memory cell array including a plurality of memory cells arranged in rows and columns, each memory cell including a nonvolatile transistor;
- a plurality of row lines, each connected to those of said memory cells arranged on a corresponding row;
- a plurality of column lines, each connected to those of said memory cells arranged on a corresponding column;
- column line select transistors for selecting a one of said plurality of column lines;
- column address buffer means for outputting internal column address signals in response to received external column address signals;
- column decoding means for selectively biasing said column line select transistors to select said column line in response to said internal column address signals;
- row address buffer means for outputting internal row address signals in response to received external row address signals;
- row decoding means, including a plurality of row decoders, for selectively biasing one of said row lines in response to said internal row address signals;
- control means, operative in a first mode, for controlling said row decoding means connected to one of said row decoders and for setting the row line corresponding to said row decoder at a predetermined potential, said selected column line consequently being set to a first potential when said control means is in said first mode and said received external row address signals are set to a predetermined state; and
- sensing means for detecting the potential of said selected column line and for supplying an output signal to an external terminal in response thereto when said control means is in said first mode.

6. A nonvolatile semiconductor memory device according to claim 5,
- wherein an external power source supplies an external power signal having a power source voltage, and
- wherein said control means is in the first mode when a voltage of a predetermined external input signal is at least equal to a predetermined voltage greater than said power source voltage.

7. A nonvolatile semiconductor memory device according to claim 6, wherein said predetermined external input signal is one of said external row address signals.

8. A nonvolatile semiconductor memory device receiving external row and column address signals, comprising:
- a memory cell array for storing data, including a plurality of memory cells arranged in rows and columns, each memory cell including a nonvolatile transistor;
- a plurality of row lines, each connected to those of said memory cells arranged on a corresponding row;
- a dummy row line not connected to said memory cells;

a plurality of column lines, each connected to those of said memory cells arranged on a corresponding column;

a plurality of dummy memory cells arranged in a column, each dummy memory cell including a nonvolatile transistor and connected to said row lines including said dummy row line;

a dummy column line connected to said plurality of dummy memory cells commonly;

column line select transistors for selecting a one of said column lines;

column address buffer means for outputting internal column address signals of a selected memory cell in response to the received external column address signals;

column decoding means for selectively biasing said column line select transistors to select said column line of said selected memory cell in response to said internal column address signals;

row address buffer means for outputting internal row address signals in response to the received external row address signals;

row decoding means for selectively biasing said row line or dummy row line;

control means, operative in a first and a second mode, for controlling said row address buffer means and said row decoding means, wherein, in said first mode, said control means sets said internal row address signals in a predetermined state and sets said row decoder means to select only said dummy row line, said selected column line consequently being set to a first potential and wherein, in said second mode, said control means sets said internal row address signals in the predetermined state in response to said received external row address signals, said selected column line consequently being set to one of said first potential and a second potential corresponding to stored data in said selected memory cell; and sensing means for detecting said potential of said column line selected by said column line select transistors and for supplying an output signal to an external terminal in response thereto when said control means is in said first and second modes.

9. A nonvolatile semiconductor memory device according to claim 8, wherein said sensing means compares said potential of said column line selected by said column line select transistors with a potential of said dummy column lines and supplies said output signal in response to the comparison.

10. A nonvolatile semiconductor memory device according to claim 8, wherein said control means is in the first mode when a voltage of a predetermined external input signal is at least equal to a predetermined voltage greater than a power source voltage supplied from a power source through an external terminal, and wherein said control means is in the second mode when the voltage of said predetermined external input signal is smaller than said predetermined voltage.

11. A nonvolatile semiconductor memory device according to claim 10, wherein said predetermined external input signal is an external control signal and is supplied to said control means.

12. A nonvolatile semiconductor memory device according to claim 8, further comprising additional dummy memory cells, including nonvolatile transistors connected to said column lines respectively and to said dummy row line commonly, and programming means for selectively programming data in said additional dummy memory cells.

13. A nonvolatile semiconductor memory device according to claim 12, wherein said programming means supplies high voltage sufficient for programming said nonvolatile transistors connected to said dummy row line.

14. A nonvolatile semiconductor memory device according to claim 8, wherein said control means comprises:

first and second signal-receiving terminals to which external chip-enable and output-enable signals are supplied respectively;

high-voltage detecting means, connected to said first signal-receiving terminal, for outputting interval test signals setting said memory device in a test mode when the voltage of said external chip-enable signal is at least equal to a predetermined voltage greater than a power source voltage supplied from a power source through an external terminal;

a chip-enable buffer circuit, connected to said first signal-receiving terminal, for generating an internal chip-enable signal setting said memory device in an active or a standby state in response to said external chip-enable signal, wherein, when the memory device is in the test mode, said external chip-enable signal sets said memory device in the active state;

an output-enable buffer circuit connected to said second signal-receiving terminal for generating an internal output-enable signal controlling said sensing means to supply said output signal to said external terminal, wherein said output-enable signal enables said sensing means to supply said output signal to said external terminal; and a row line setting circuit for generating an address controlling signal connected to said row address buffer means for setting said row address signals in said predetermined state.

15. A nonvolatile semiconductor memory device according to claim 14, wherein said control means is set in said first or second mode in response to said output-enable signal when the memory device is in the test mode.

16. A nonvolatile semiconductor memory device according to claim 15, , wherein said row decoding means includes a plurality of row decoders each connected to a corresponding row line and one of said row decoders further includes a first potential-setting means for setting the potential of a corresponding row line to a preset potential level in response to said internal test signals when the memory device is set in the test mode.

17. A nonvolatile semiconductor memory device according to claim 16, wherein said row decoding means includes a dummy row decoder connected to said dummy row line and receiving the same internal row address signals as said row decoder including said first potential-setting means, and wherein said dummy row decoder includes a second potential-setting means for setting the potential of said dummy row line to said preset potential level in response to said internal test signals when the memory device is not in the test mode.

* * * * *